(12) United States Patent
Nishizato et al.

(10) Patent No.: US 6,752,387 B1
(45) Date of Patent: Jun. 22, 2004

(54) METHOD AND AN APPARATUS FOR MIXING AND GASIFYING A REACTANT GAS-LIQUID MIXTURE

(75) Inventors: Hiroshi Nishizato, Yachiyo (JP); Hideaki Miyamoto, Miyanohigashi-machi (JP)

(73) Assignee: Stec Inc., Kyoto (JP)

( * ) Notice: Subject to any disclaimer, the term of this patent is extended or adjusted under 35 U.S.C. 154(b) by 0 days.

(21) Appl. No.: 09/661,026

(22) Filed: Sep. 13, 2000

(30) Foreign Application Priority Data

Sep. 14, 1999 (JP) .............................. 11-260819
Jul. 26, 2000 (JP) ........................ 2000-225445

(51) Int. Cl.[7] ................................. B01F 3/04
(52) U.S. Cl. ................ 261/62; 261/44.5; 261/66; 261/142; 261/DIG. 65; 118/726
(58) Field of Search ............. 261/38, 44.3, 44.5, 261/62, 63, 66, 142, DIG. 65, DIG. 68; 251/331; 118/726

(56) References Cited

U.S. PATENT DOCUMENTS

| | | |
|---|---|---|
| 3,889,538 A | 6/1975 | Fingerle |
| 3,930,908 A | 1/1976 | Jolly |
| 4,232,063 A | 11/1980 | Rosler et al. |
| 4,241,761 A | 12/1980 | Miller |
| 4,558,845 A | 12/1985 | Hunkapiller |
| 4,579,080 A | 4/1986 | Martin et al. |
| 4,668,365 A | 5/1987 | Foster et al. |
| 4,761,269 A | 8/1988 | Conger et al. |
| 5,000,113 A | 3/1991 | Wang et al. |
| 5,035,200 A | 7/1991 | Moriyama et al. |
| 5,203,925 A | 4/1993 | Shibuya et al. |
| 5,272,880 A | * 12/1993 | Nishizato et al. |
| 5,419,924 A | 5/1995 | Nagashima et al. |
| 5,431,736 A | * 7/1995 | Boer |
| 5,431,763 A | 7/1995 | Bradshaw |
| 5,520,001 A | * 5/1996 | Miyamoto et al. |
| 5,630,878 A | * 5/1997 | Miyamoto et al. |
| 5,645,642 A | * 7/1997 | Nishizato et al. |
| 5,865,421 A | 2/1999 | Ono |
| 6,006,701 A | * 12/1999 | Nagano |
| 6,131,307 A | * 10/2000 | Komino et al. |
| 6,167,323 A | * 12/2000 | Komino et al. |
| 6,179,277 B1 | * 1/2001 | Huston et al. |
| 6,224,681 B1 | * 5/2001 | Sivaramakrishnan et al. |

FOREIGN PATENT DOCUMENTS

| | | |
|---|---|---|
| EP | 0 058 571 | 8/1982 |
| EP | 602595 | 6/1994 |
| FR | 713721 | 10/1931 |
| JP | 8-800525 | * 8/1996 |
| JP | 09-036108 | 2/1997 |

* cited by examiner

Primary Examiner—Scott Bushey

(57) ABSTRACT

A method of gasifying a liquid material that is entrained with a carrier gas includes mixing liquid material with a carrier gas in a control valve that can be heated. The gas-liquid mixture is maintain at a first pressure level that is sufficiently higher than the pressure level downstream of a nozzle in the valve to thereby provide a total gasification of the gas-liquid mixture. The control valve can position the liquid in a reservoir radially outward from a valve seat and an elongated mixing chamber can be positioned within the valve seat and connected to both a carrier gas and the release nozzle.

14 Claims, 10 Drawing Sheets

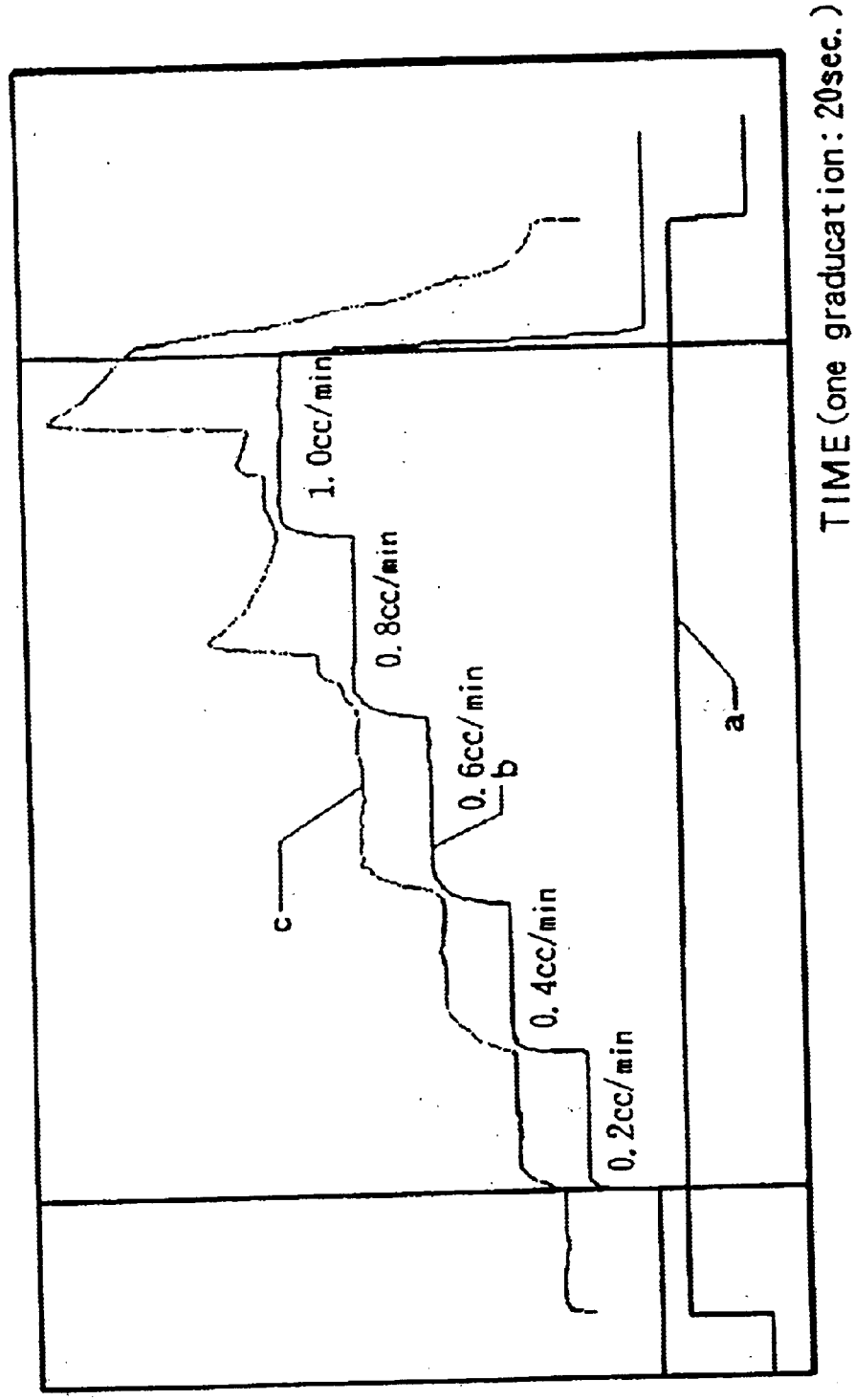

METHOD AND AN APPARATUS FOR MIXING AND GASIFYING A REACTANT GAS-LIQUID MIXTURE

BACKGROUND OF THE INVENTION

1. Field of the Invention

The present invention provides a method and apparatus for mixing and gasifying a reactant gas-liquid and more particularly a method and device that can provide stable control of a delivery of a reactant gas over a range of flow rates to, for example, a semiconductor production line.

2. Description of Relevant Art

Among the conventional liquid material gasifying apparatus, there is a device which is designed to gasify a liquid material within a three-way control valve equipped with a flow control function, as described, for example, in U.S. Pat. No. 5,419,924. FIG. 9 is a view showing a principal part of this liquid material gasifying apparatus. A control valve 70 is furnished with a flow control function, with a valve body 71 formed with a recess 72. The part 73 is a driving part which is provided to block a portion of the recess 72, and is furnished with a plunger 74 which rises and descends in the recess 72. A valve seat 75 is formed on the upper part of a projection 76 projecting upward from the center of the bottom face of the valve body 71. A flexible diaphragm 77 divides the inside of the recess 72 into an upper space 78 including the plunger 74 and a lower space 79 including the valve seat 75, and the diaphragm 77 is constituted to come into scaling contact with the upper surface of the valve seat 75 by the descending of the plunger 74 to seal the valve seat 75.

A liquid material introduction channel or route 80 is formed to penetrate vertically from the center of the bottom face of the valve body 71 to a position where the diaphragm 77 on the upper face of the valve seat 75 can come into tight contact. A carrier gas induction route 81, and a mixed gas discharge route 92, which are formed to communicate in a space formed around the valve seat 75 at the time when the diaphragm 77 is brought into tight contact with the upper face of the valve seat 75.

In the control valve 70 of the above constitution, a liquid material 83 from a liquid material tank (not illustrated) is led upward in the liquid material introduction route 80 and introduced into the control valve 70 with the flow rate controlled, and a carrier gas 84 at a high temperature (e.g., 70°C.) from a carrier gas source (not illustrated) is introduced into the control valve 70 through the carrier gas introducing route 81. The control valve 70 allows the liquid material to be in contact with the high temperature carrier gas 84 to gasify the liquid material 83 into reactant gas, so that this reactant gas is mixed with the carrier gas 84, and this mixed gas 85 is led outside the control valve 70 through the mixed gas discharge route 82.

However, in the above liquid material gasify apparatus, the efficiency of actual use of the carrier gas 84 can be poor, and there is a possibility that the liquid material 83 cannot always be gasified into a stabilized state with good efficiency. This situation can be explained while referring to FIG. 10 and FIG. 11.

Firstly, FIG. 10 shows the flow of the liquid material 83 and the carrier gas 84 in an open state of the valve seat 75, in which the carrier gas 84, introduced into the lower space 79 through the carrier gas induction route 81 flows between the upper surface of the valve seat 75 and the diaphragm 77, as shown by arrow marks 84a to come into contact across the surface of the liquid material 83 which has been guided upward in the liquid material induction route 80. During this operation, a major part of the carrier gas 84 flows in such a manner to be diverted along the perimeter of the valve seat 75 and the body projection 76 underneath, as shown in arrow marks 84b. As a result of such diversion of flow, the introduced high temperature carrier gas 84 does not necessarily make a major contribution to an acceleration of the gasification of the liquid material 83, and accordingly, the partial pressure above the liquid surface may come to a nearly saturated condition, so that condensation is apt to be formed.

In the above liquid material gasifying apparatus, there is a possible drawback that, when the amount of induction of the liquid material 83 into the control valve 70 increases, gasification of such material will not be stable. That is, when a change in the gas flow from the control valve 70 was observed at time periods of having increased stepwise amounts of induction of the liquid material 83 into the control valve 70 while retaining the amount of induction of the carrier gas 84 constant, the results as shown in FIG., 11 were obtained.

In FIG. 11, the mark a shows an amount of induction of the carrier gas 84, which is in this example is 2000 cc/min. And, the mark b shows the amount of induction of the liquid material (e.g., ethanol) 83, which is in this example changed stepwise from 0.2 cc/min. to 1.0 cc/min. Further, the mark c represents a change in flow volume of the gas led out from the control valve 70. From this FIG. 11, it can be seen that the gas flow volume changes over a relatively stabilized manner when the induction amount of ethanol 83 is relatively small, but when the induction amount increases, overshooting or wide fluctuations may occur.

SUMMARY OF THE INVENTION

An object of the present invention is to provide a method for gasifying a liquid material and an apparatus thereof so that gasification of a liquid material such as a reactant can be accomplished efficiently and in a stabilized manner at all times.

In order to attain the above object, a method for gasifying a liquid material comprises mixing or entraining a liquid material and a carrier gas while providing flow control in a gas-liquid mixing unit of a control valve provided with a liquid flow control function, and discharging the gas-liquid mixture from a nozzle formed in the vicinity of the flow control unit to fully gasify the liquid material at a reduced pressure level.

An apparatus for practicing the above liquid material gasifying method includes a liquid material supply line equipped with a liquid tank and a flow meter for measuring the flow of the liquid material from the liquid tank and a carrier gas supply line equipped with a carrier gas supply source and a flow control apparatus for controlling the flow of the carrier gas. Each supply line is connected with the control valve independently from each other. A gas-liquid mixing unit and a nozzle unit are formed in close relationship to each other in the control valve, so that the liquid material introduced into the control valve by the above liquid material supply line is released into the carrier gas by an annular gap between a diaphragm and a valve seat. Thus, the liquid material is at a higher pressure than the carrier gas and is released radially inward in controlled discrete amounts to mix with the carrier gas within a mixing channel. Heat can be supplied to both the nozzle unit and the valve seat to raise the temperature of the liquid material. The carrier gas is introduced into the mixing channel of the control valve by the carrier gas supply line while controlling the flow volume, the gas-liquid mixture formed at this time is discharged from the above nozzle to gasify the liquid material at a reduced pressure level, and the gas formed by gasification, along with the carrier gas, is taken out from the gas discharge route on the downstream side of the nozzle.

Flow control of the liquid material in the above control valve may be made based on the output of a flow meter for the liquid or the output of the flow meter for the gas which is provided on the gas supply line.

In this invention, the liquid material and the carrier gas are mixed while controlling the flow in the gas and liquid mixing unit in the control valve equipped with a liquid flow control function, and the gas-liquid mixture can be subjected to reduced pressure instantly at the nozzle, so that the liquid material can be gasified in good efficiency and in a stabilized condition.

BRIEF DESCRIPTION OF THE DRAWINGS

The exact nature of this invention will be readily apparent from consideration of the following detailed description in conjunction with the accompanying drawings, wherein:

FIG. 11 is a view for explaining the gasification condition with the above conventional liquid material gasifying apparatus.

DESCRIPTION OF A PREFERRED EMBODIMENT OF THE INVENTION

The following description is provided to enable any person skilled in the fluid controls for the semiconductor industry to make and use the invention and sets forth is the best modes contemplated by the inventors of carrying out their invention. Various modifications, however, will remain readily apparent to those skilled in these arts, since the generic principles of the present invention have been defined herein specifically to provide an economical and practical control unit for gasifying a reactant liquid.

Figure 1:
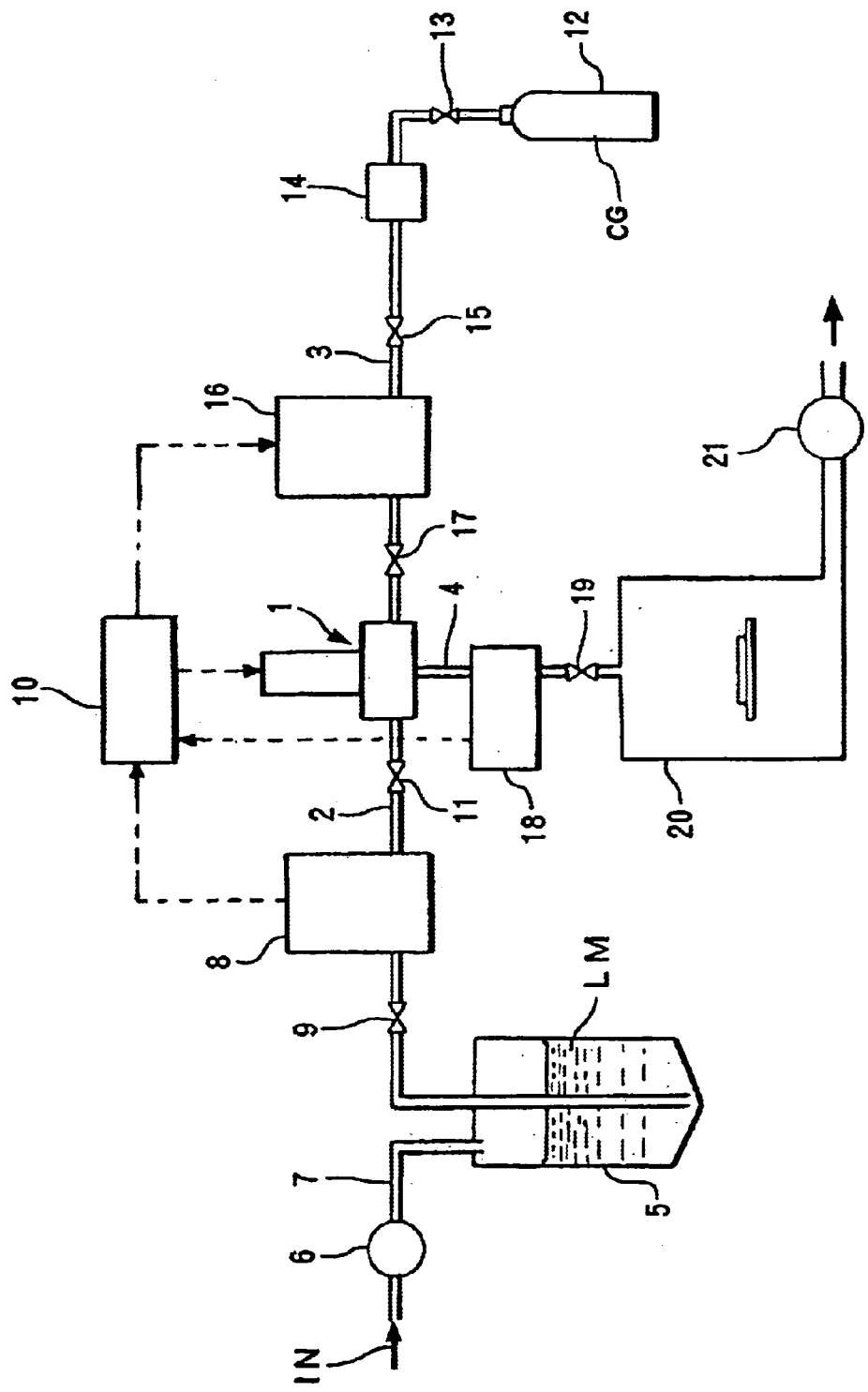
FIG. 1 is a view to show schematically a liquid material gasifying apparatus according to this invention.

An embodiment of this invention is explained while referring to the drawings. FIG. 1 shows schematically a constitution of a liquid material gasifying system. A control valve 1 is equipped with a liquid flow control function (the constitution thereof is explained in detail later), and on the left side part of the control valve 1 a liquid material supply line 2 is connected to a source of a desired liquid reactant. On the right side part a carrier gas supply line 3 is connected to a source of an appropriate carrier gas, and on the lower side part a gas leading out line 4 is connected to provide the desired gas state of the carrier gas and reactant material to the production unit.

The liquid material supply line 2 is connected to a reactant liquid material tank in which a liquid material LM is contained in a gas-tight condition, and on the upstream side thereof an inert gas supply pipe 7 having a regulator 6 is connected. By the supply of inert gases such as $N_2$, He, Ar and the like to the upper space in the liquid material tank 5 from the IN in the figure, the liquid material LM is extruded or forced into the liquid material supply line 2. A flow meter 8 for liquid is provided on the downstream side of the liquid material tank 5 through an open/close valve 9 and can measure the flow volume of the liquid material LM flowing from the liquid material tank 5. The flow meter 8 for liquid can be, for example, a known liquid mass flow meter. The results of detection of the liquid flow meter 8 are sent out to an apparatus control unit 10 which can control the entire system or at least can carry out an operation based on the detected signal. An open/close valve 11 is interposed between the flow meter 8 and the control valve 1.

The carrier gas supply line 3 is constituted in the following manner. Namely, a carrier gas supply source 12 such as a cylinder tank is provided on the upstream side of the carrier gas supply line 3 to supply an inert gas such as $N_2$, He, Ar, and the like as a carrier gas CG. On the downstream side of supply source 12 there are provided a pressure regulator 14, an open/close valve 13, and further a flow control apparatus 16 and an open/close valve 15. This flow control apparatus 16 permits the carrier gas CG to be supplied to the control valve 1 in predetermined fixed amounts and a control aperture can be regulated on the basis of a control signal from the apparatus control unit 10. As a flow control apparatus 16, for example, a known gas mass flow controller can be used. An open/close valve 17 is interposed between the flow control apparatus 16 and the control valve 1.

The gas leading out or discharge line 4 is constituted in the following manner. A flow meter 18 for the exiting mixed gas from the control valve 1 is interposed in the gas leading out line 4, and is designed to measure the flow of the gas (as described later, a mixed gas formed by gasification of the liquid material LM with the carrier gas CG) released from the control valve 1, and the results of the measurement are sent to the apparatus control unit 10. The flow meter 18 can be, for example, a known gas mass flow meter.

On the downstream side of this flow meter 18 there is provided a reaction furnace process chamber, reaction chamber, deposition chamber, etc. 20. An open/close valve 19 can stop the flow. This reaction furnace 20 cab be a semiconductor manufacturing apparatus such as for example a CVD apparatus. A gas suction pump 21 can be connected to the reaction furnace 20 for removing waste gases from the reaction furnace 20.

Next, the control valve 1 is explained while referring to FIGS. 2 to 5.

Figure 2:
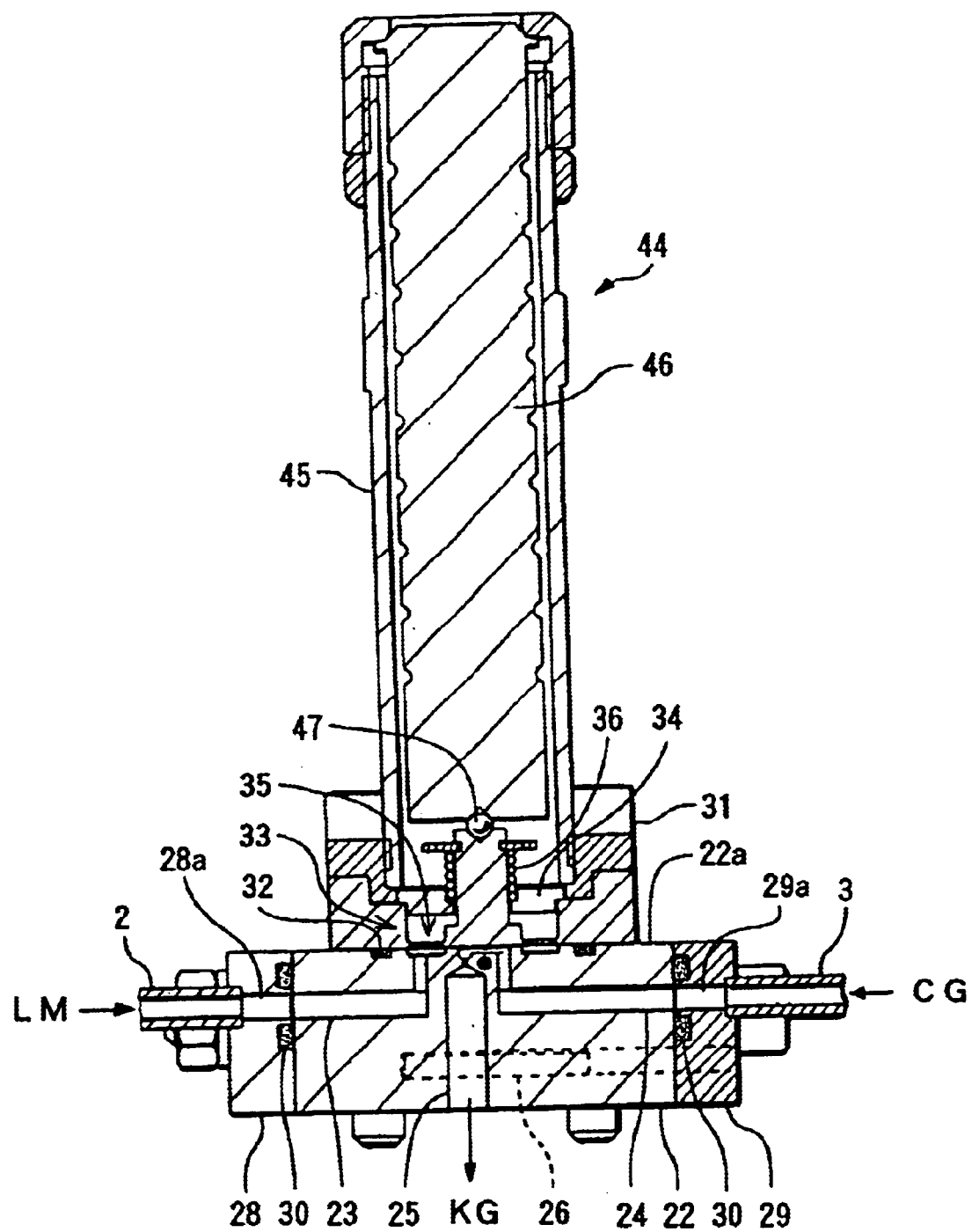
FIG. 2 is a vertical section showing an example of a control valve in the above liquid material gasifying apparatus.

In FIG. 2, a rectangular parallelepiped shaped body block 22 is consumed of, for example, a material rich in heat resistance and corrosion resistance, such as stainless steel. Inside this body block 22 there are formed three flow routes or conduits 23, 24, and 25.

The flow route 23 introduces the liquid material LM into the gas-liquid mixing unit 39 to be described later. This liquid material induction route 23 can be formed as a reverse L-letter shape in cross-section such that its one end is open to the left side face of the body block 22, and the other end is open to the upper face of the body block 22. Flow route 24 introduces the carrier gas CG into a central gas liquid mixing unit 39. This carrier gas induction route 24 shows an L-letter shape in cross-section such that its one end is open to the right side face of the body block 22, and the other end is open to the upper face of the body block 22. The flow route 25 functions as a gas discharge route. This gas discharge route 25 opens at its one end to the lower face of the body block 22, and at the other end it is formed in nearly a straight line up to an appropriate position of the body block 22, with its upper end side being linked with the gas-liquid mixing unit 39 through a gas discharge nozzle 42 to be described later.

A heater 26 for heating the whole body block 22, comprising for example a cartridge heater, which is self-contained in a freely detachable manner is provided in the vicinity of the gas discharge route 25. A thermocouple 27 is used as a temperature sensor for detecting the temperature of the body block 22. The heater 26 can be set to optimize the temperature of a particular liquid reactant material and since the liquid reactant material is released in small discrete amounts across an annular flat valve seat, it is more susceptible to having its temperature effected by direct contact with the block 27 rather than by evaporation directly into a heated carrier gas flowing across the surface of the liquid.

The parts 28, 29 are the connection blocks to be provided in a freely detachable manner through a seal member 30 on the right and left side faces of the body block 22. Within the blocks 28,-29, there are formed the flow routes 28a, 29a which communicate with the liquid material induction route 23 and carrier gas induction route 24, respectively, so that the respective parts of the liquid material induction route 23 and the carrier gas induction route 24 are connected with the external liquid material supply line 2 and the carrier gas supply line 3, through the blocks 28, 29. In FIG. 2, no reference is made to the connection structure between the gas leading out route 25 and the external gas leading out line 4, but needless to say, an appropriate connecting member is used to make the predetermined connection.

Figure 3:
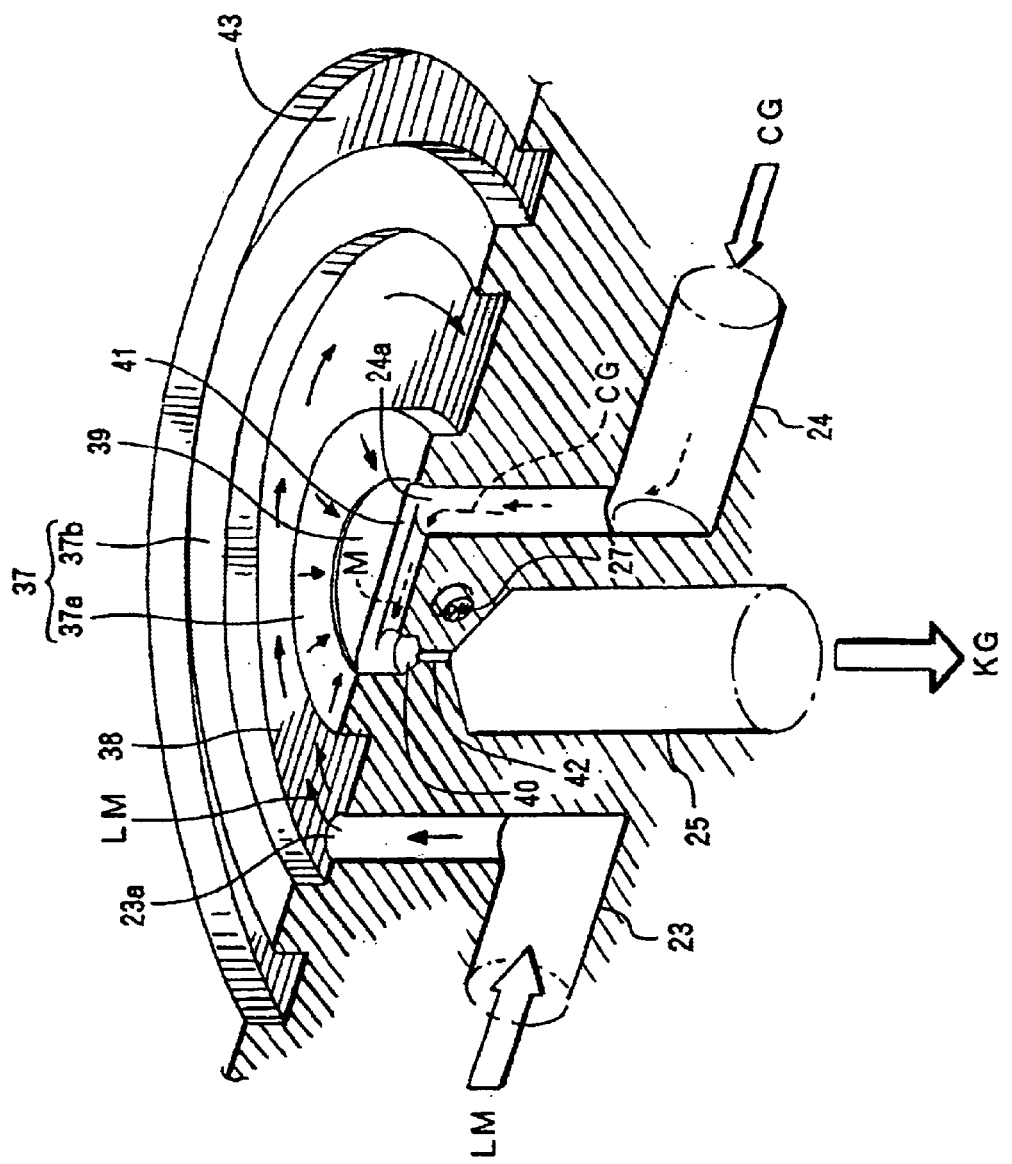
FIG. 3 is a perspective view of a vertical section of a valve seat and nozzle of the control valve.

Next, the constitution in the upper face of the above body block 22 is explained while referring to FIGS. 2 to 4. In FIG. 2, the part 31 is a valve block, which is placed on the upper face 22a of the body block 22 through an O-ring 32, and is made from material having good heat conductivity and corrosion resistance such as stainless steel. Between this valve block 31 and the upper face 22a, there is formed a valve body 33 having a liquid flow control function. That is to say, in the internal space 34 of the valve block 31, a diaphragm 35 is provided in such a manner to be normally biased or forced upward by a spring 36.

Figure 5:
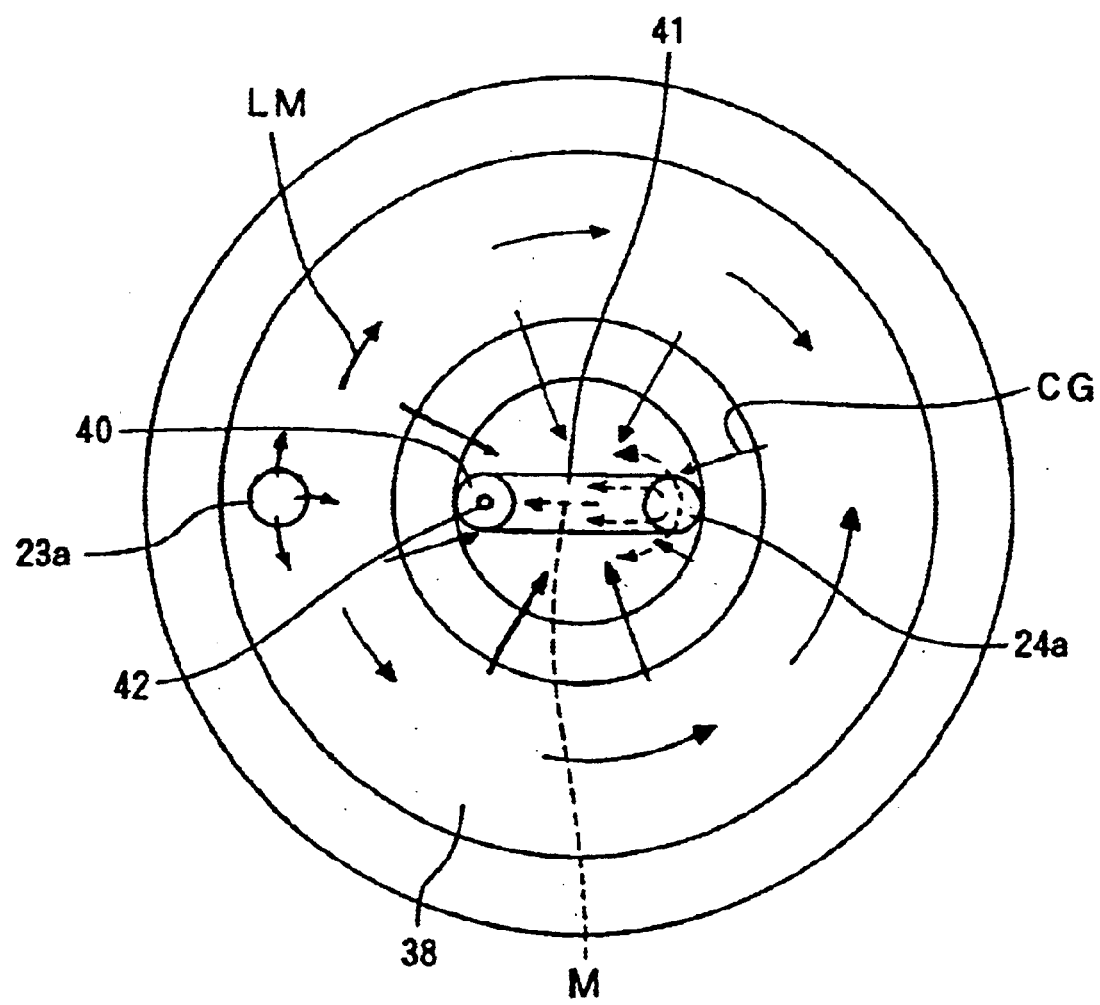
FIG. 5 is a view for explaining the fluid motion of the gas-liquid mixing unit in the control valve.

In the upper face 22a of the body block 22 with reference to FIG. 3 and FIG. 5, a valve seat 37 is formed in approximately the central part of the top face 22a, and comprises two annular partition walls 37a, 37b, and constitutes the valve body 33 along with the diaphragm 35. A reservoir 38 which can be annular when viewed traverse to a plane extending across the two valve seats 37a, 37b, is formed in a manner to include the opening 23a of the liquid material induction route 23 on the downstream side, and functions as a liquid flow route surrounding the valve seat wall 37b on one radially outer side.

In the recess 39 which is circular when viewed traverse to the plane surrounded by the inside valve seat 37a, as shown in FIG. 5, there are provided an opening 24a on the downstream side of the carrier gas induction route 24 and a hole 40 leading to the gas discharge route 25, and a shallow slender groove 41 which is centrally located and communicates with openings 24a and hole 40. The groove 41 provides a mixing chamber which facilitates a mixing of the liquid with the carrier gas CG. The carrier gas CG flowing in from the opening 24a and the liquid material LM flowing into the recess 39 from the reservoir 38 the controlled gap between the inside surface of the valve seat 37a and the bottom surface of the diaphragm 35 are mixed, and the system functions as a gas liquid mixing unit.

A nozzle 42 with a restricted orifice is formed between the hole or recess 40 and the gas discharge route 25. This nozzle 42 has a considerably small diameter and length such that the diameter is no more than 1.0 mm, and the length is no more than 1.0 mm. Other dimensions of the nozzle for particular reactants can be employed. Further, this nozzle 42 is provided in a position as close as possible to the gas liquid mixing unit 39. From this nozzle 42, the gas-liquid mixture M formed in the gas-liquid mixing unit 39 is discharged into the gas discharge route 25, by which the liquid material LM included in the gas-liquid mixture M is subjected to a reduced pressure to be completely gasified. The resulting gas LM is mixed with the carrier gas CG to become a mixed gas KG. The particular size of the orifice of the nozzle, pressure levels and temperatures can vary depending on the particular liquid rent Additionally, the gas discharge route 25 can be heated to maintain the gas state as it is transported to the furnace 20.

In FIG. 3, an annular recess 43 is an O-ring holding groove which is formed on the outside of the outside valve seat 37b, so that the O-ring 32 can provide a seal.

Figure 4A:
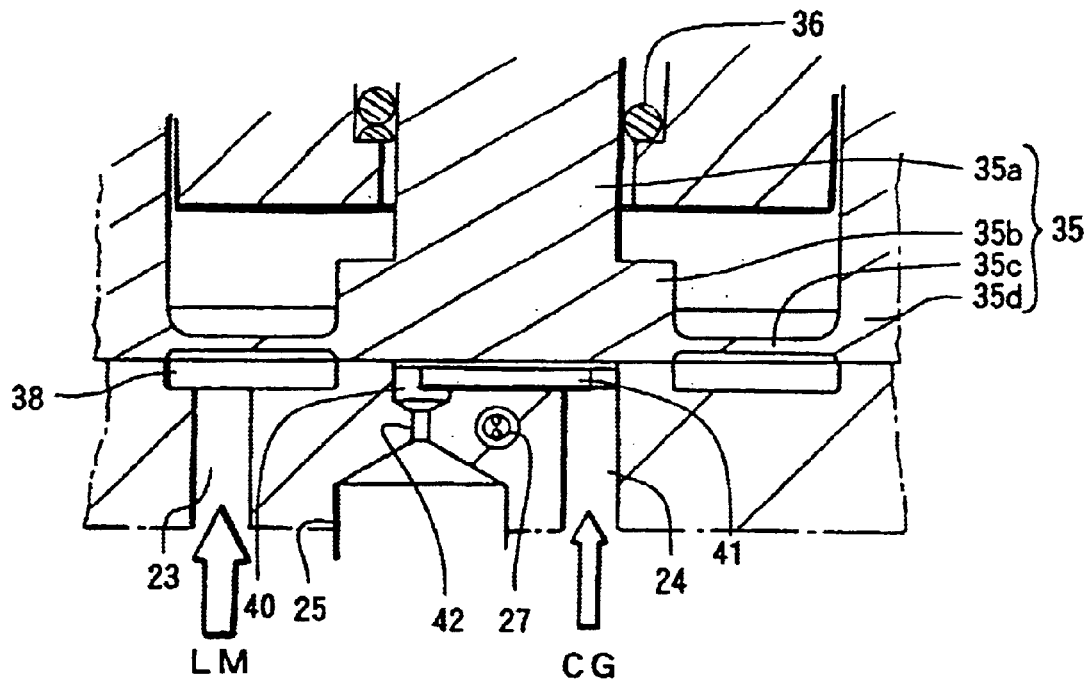
FIGS. 4(A) and 4(B) are views for explaining the motion of the above control valve, wherein 4(A) is a view showing a closed condition of the valve, and 4(B) is a view showing an open condition of the valve.
Figure 4B:
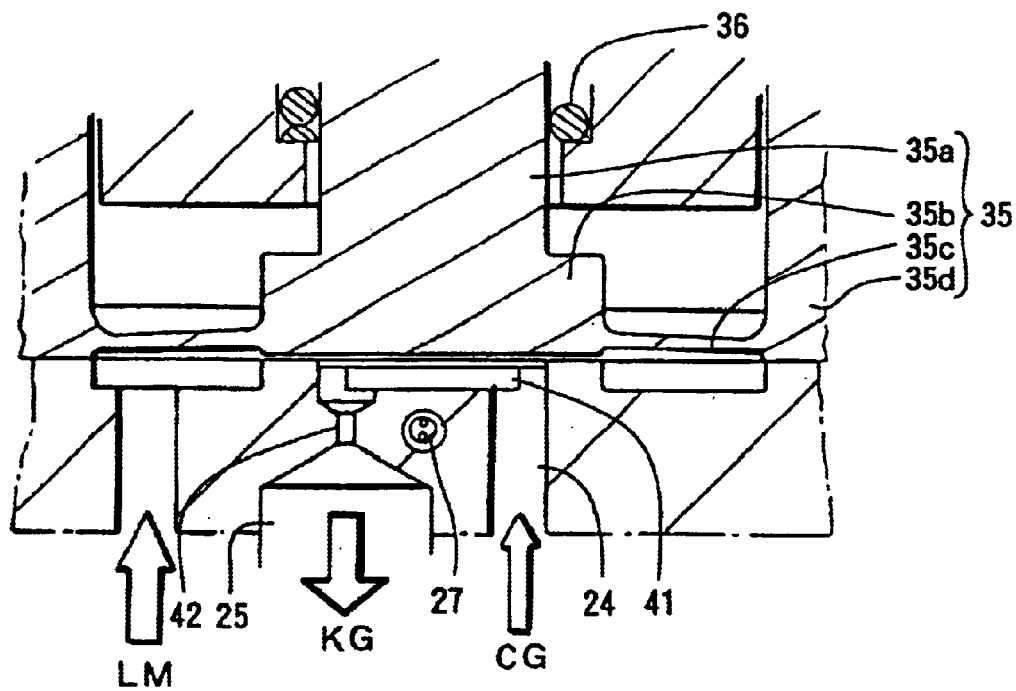

The diaphragm 35 comprises a material having good heat resistance and corrosion resistance and adequate elasticity to appropriately flex, and as shown in FIGS. 4(A), 4(B), it can include a valve unit 35b which can come into contact with or release from the upper face of the valve seat 37a underneath the shaft 35a, and has a thin wall part 35c extending around its perimeter, and further, comprises a radially outward thick wall part 35d extending around the thin wall part 35c. It is so constituted that, it is biased upward by a spring 36, and the valve part 35b is separated from the valve seat 37a, but when a pressing force acts downward on the shaft 35a, the valve 35b is displaced in a direction to come into contact and close the valve seat 37a.

An actuator unit 44 can press the diaphragm 35 downward to distort it. In this embodiment, actuator unit 44 is constituted as a piezo-actuator in which a piezo-stack 46 is provided by laminating a plurality of piezoelectric elements in a housing 45 erected on the upper part of the valve block 31, and the pressing part 47 underneath the piezo-stack 46 is brought into contact with the axial part 35a of the diaphragm 35.

Operation of the liquid material gasifying apparatus will now be explained When an inert gas is supplied to the liquid material tank 5, the liquid material LM in the liquid material tank 5 is pressurized, and the liquid material LM flows in the liquid material supply line 2 in the direction of the control valve 1. The flow of this liquid material LM is measured by the liquid flow meter 8, and the results of the measurement are inputted to the apparatus control unit 10 while the liquid material LM is introduced into the control valve 1. A control signal is sent to the control valve 1 from the apparatus control unit 10 so as to make the flow proportionate to a liquid flow setting signal which is set by an operator for the particular demands of the reaction furnace 20. As a result, the piezo-actuator 44 is operated to adjust the aperture opening of the valve body 33. The liquid material LM which is introduced into the control valve 1 reaches the liquid flow route 38 through the liquid material induction routes 23, and further, as shown in FIGS. 3 and 5, goes into the gas-liquid mixing unit 39, which is brought to an appropriate temperature through the gap in between the valve seat 37a and the valve part 35b of the diaphragm 35 from the liquid flow route 38.

On the other hand, the carrier gas CG from the carrier gas supply source 12 is subjected to flow control in the flow control apparatus 16 and sent in the direction of the control valve 1 to the gas-liquid mixing unit 39 in the control valve 1. The carrier gas CG which is introduced into the control valve 1 is sent into the gas-liquid mixing unit 39 through the carrier gas induction route 24, as shown in FIG. 3. The relative pressures of the liquid material LM and carrier gas CG is such that the liquid material can be at a slightly higher pressure and will flow as shown in the arrows of FIG. 3.

The liquid material LM and the carrier gas CG which entered into the above gas-liquid mixing unit 39 are mixed with each other especially within the slender groove 41 which is formed on the gas-liquid mixing unit 39, and as the liquid material LM is mixed with the carrier gas CO while flowing into the groove 41, the two members LM and CG are sufficiently mixed together to become a gas-liquid mixture M.

The above gas-liquid mixture M is led through the hole or recess 40 of the gas-liquid mixing unit 39 and discharged to the gas discharge route 25 from the nozzle 42. At this time, the liquid material LM in the gas-liquid mixture M is subjected to a reduced pressure downstream of the exit aperture of the nozzle and instantly the liquid potion of the mixture M becomes a gas. This gas is mixed with the carrier gas CO in the gas-liquid mixture M to become a mixed gas KG and flows to the downstream side through the gas discharge route 25. At this time, since the gas discharge route 25 is further heated by the heater 26, no dew condensation should occur.

The above carrier gas CG is provided with a relatively high pressure condition at the front side of the nozzle 42 (upstream side), and the gas CG can further be pre-heated (not shown) to elevate the temperate to insure the efficiency of the above heater 26. In addition, because it is not only for increasing the heating efficiency of the carrier gas CG per se, but also to have liquid material LM compulsorily mixed with the carrier gas CG in the nozzle 42, heat transfer from contact with the carrier gas CG by the liquid material LM is also encouraged. Due to these factors, heat transfer efficiency from the heater 26 to the liquid material LM is further elevated, and the gasification efficiency of the liquid material LM is increased, and the flow of the gasified liquid material LM is rendered efficient, with the result that even a lowering of the temperature necessary for gasifying the liquid material LM becomes possible, so that curtailment of the energy cost can be achieved.

In addition, the gas concentration of the liquid material LM, which is discharged from the nozzle 42 and gasified in the release process where the gas-liquid mixture M is led from the gas-liquid mixed part 39 to the downstream side of the gas discharge route 25, is lowered by the presence of the carrier gas CG, and, accompanied with this, the temperature necessary for preventing the gasified liquid material LM from being liquefied and forming dewdrops in the gas discharge route 25 is lowered, with the result that it becomes possible to further curtail the energy cost for heating the gas discharge route 25. Besides, as the liquid material LM loses its heat by adiabatic expansion at the time when it is discharged from the nozzle 42 and gasified, normally gasification efficiency is lowered, but in this embodiment, it is possible to supplement the heat lost by the liquid material LM by the temple of carrier gas CG to be mixed with the liquid material LM, and thereby making it possible to achieve an improvement in the gasification efficiency of the liquid material LM.

When the above mixed gas KG is supplied for use in the reaction furnace 20 through the gas discharge line 4, the flow of the mixed gas KG is measured by the flow meter 18 interposed in the gas discharge line 4, and the results thereof are sent to the apparatus control unit 10.

In the liquid material gasifying apparatus of the present invention, transportation of the liquid material LM to the reaction furnace 20 can be performed by mixing with the carrier gas CG at a high speed, so that it is possible to send the desired quantity of liquid material LM in a gas from to the reaction furnace 20 at a high speed, and thus it is possible to meet a case where a high speed response is required.

In summary, the control valve 1 provides a heater 26 for heating the body block 22. A valve body 31 is mounted on the body block 22 and includes a diaphragm 35 that can contact the valve seat 37. An annular recess 38, around the valve seat 37, receives a liquid material. At the center of the valve seat is a recess or gas liquid mixing unit 39. A carrier gas is induced into the flow route 24 to extend into the gas liquid mixing unit 29. A shallow slender groove 41 extends across the center of the mixing units The liquid flows between an annular gap between the diaphragm and the inside valve seat 37a shown in FIG. 3. The diaphragm 35 permits a mixing with the carrier gas so that it can be delivered to a hole 40 that, in turn, is connected to the nozzle 42. Thus, there is a mixing of the carrier gas and the liquid in the mixing unit 39 and when this combination of gas and liquid particles is subsequently released through the nozzle 42, the reduction in pressure ensures the gasification of the liquid material.

In operation, the liquid materials pressurized and can be measured by a liquid flow meter and an actuator can adjust the aperture of the valve body. The liquid then passes over the valve seat to flow into the gas liquid mixing unit 39 which is also heated. The carrier gas is also introduced into the gas liquid mixing unit 39. A slender mixing groove 41 is designed to receive the gas/liquid mixture as it flows along the groove 41. Since the discharge area beyond the nozzle 42 is also heated, it is possible to ensure that no dew condensation will be discharged. As can be appreciated, instead of a carrier gas flowing across a reactant or liquid inlet end opening, liquid in the present invention is released radially inward across the valve seat 37a and enters into a slender shallow groove 41 for intermixing with a carrier gas. Additionally, since the liquid material is under pressure, an annular variable ring nozzle is provided be the diaphragm and the surface of the valve seat 37a so that the liquid is drawn into the mixing unit 39 to be entrained into the carrier gas. Thus, the carrier gas does not pass outwardly over the valve seat 37a.

Figure 6:
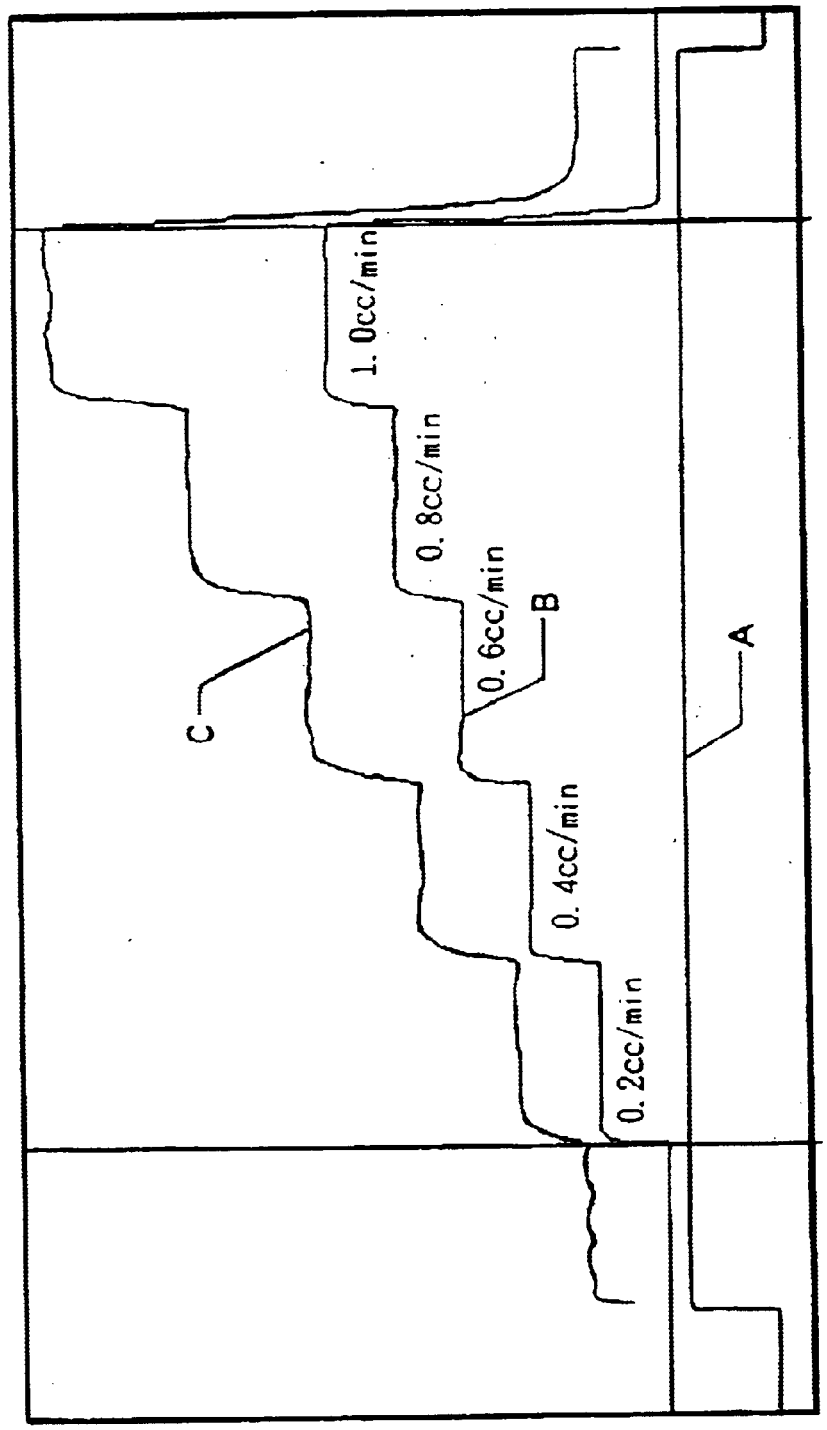
FIG. 6 is a view for explaining the gasification condition provided by the liquid material gasifying apparatus.

FIG. 6 shows measurement data obtained at the time of gasifying a liquid material LM by the above liquid material gasifying apparatus and represents the results of observation of a change in the output of the mixed gas KG which is discharged from the control valve 1 at the respective time periods when the induction amount of the liquid material LM into the control valve 1 is stepwise increased while retaining the amount of induction of the carrier gas CG at a constant rate.

In this example, the carrier gas CG is supplied at a constant late of 2000 cc/mim, and ethanol as a liquid material LM is supplied at the rate of 1 cc/min. through the control valve 1 to a reaction furnace 20, by making the diameter of the nozzle 42 to be 0.3 mm and the length of the nozzle 0.6 mm when the temperature of the heater 26 of the control valve 1 is 80° C., and the pressure of the gas liquid mixing unit 39 becomes about 30 kpa. At this time, the gas liquid mixture M in the gas-liquid mixing unit 39 is discharged from the nozzle 42 at a condition where the liquid material LM in the gas-liquid mixture M is gasified under reduced pressure and supplied to the reaction furnace 20.

In this FIG. 6, the mark A shows an induction amount of the carrier gas CG, which is, in this example, 2000 cc/min. The mark B shows the change of the induction amount of the ethanol as a liquid material LM in stepwise changes from 0.2 cc/min. to 1.0 cc/min The mark C in FIG. 6 represents the change in flow of the mixed gas KG led out from the control valve 1 as a change in volume.

It can be observed from FIG. 6 above that the output C of the flow meter for gas 18 is substantially stabilized between 0.2 cc/min. and 1.0 cc/min., so that the gasification of the liquid material LM is stabilize that is, a close correlation between increase liquid flow and resultant reactant gas delivery. In other words, according to the liquid material gasifying apparatus of the above constitution, it is possible to gasify in a stabilized state a larger amount of the liquid material LM than with the conventional gasifying apparatus and to generate a completely gasified output in a precise manner.

Since the above liquid material gasifying apparatus is designed to carry out a precise flow control of the liquid material LM in the control valve 1 based on the output of the flow meter 8, the liquid material LM can be supplied in an optimum amount to the gas liquid mixing unit 39.

This invention is not limited to the above embodiment but may be practiced in various modifications. For example, the liquid material induction route 23 and the carrier gas induction route 24 is not necessarily formed into a hook shape but may be straight and the heater 26 may be a plate heater. The heating range of the heater 26 may be optionally set according to the particular kind of liquid material LM. This heater 26 may also heat the neighborhood of the gas-liquid mixing unit 39 of the body block 22 or the gas discharge route 25, and especially, the addition of heat may reduce the pressure of the discharging liquid material LM from the nozzle 42 while still insuring a suitable gas state.

The flow control of the liquid material LM in the control valve 1 may be based on the output of the flow meter 18 provided in the gas leading out line 4, and when such arrangement is made, flow of the liquid material LM can be controlled at a higher precision. Furthermore, as an actuator 44, an electromagnetic type or a thermal system type may be used.

The liquid material LM is not limited to ethanol but it may be, for example, pentaethoxytantalum (PETa), trimethyl phosphate (TMPO), or other appropriate reactant material for use in the semiconductor industry.

An example of some appropriate pressures for this material in the disclosed control valve 1 are as follows:

|  | PETa | TMPO | ethanol |
| --- | --- | --- | --- |
| carrier supply pressure | 0.1 MPa(G) | 0.3 MPa(G) | 0.3 MPa(G) |
| liquid supply pressure | 0.1 MPa(G) | 0.3 MPa(G) | 0.3 MPa(G) |
| pressure of secondary side | 1 kPa | 1 kPa | atmospheric pressure |

G: gage pressure
Pressure of secondary side: absolute pressure

Furthermore, the liquid material LM is not limited to one which is in liquid state at room temperature and under normal pressure but one which, though being a gas phase at room temperature and under normal pressure, can be further a liquid at room temperature by optionally being pressurized.

In addition, the reaction vessel 20 may be a vacuum vessel, in which case a gas leading out line 4 may be at a reduced pressure.

Figure 7:
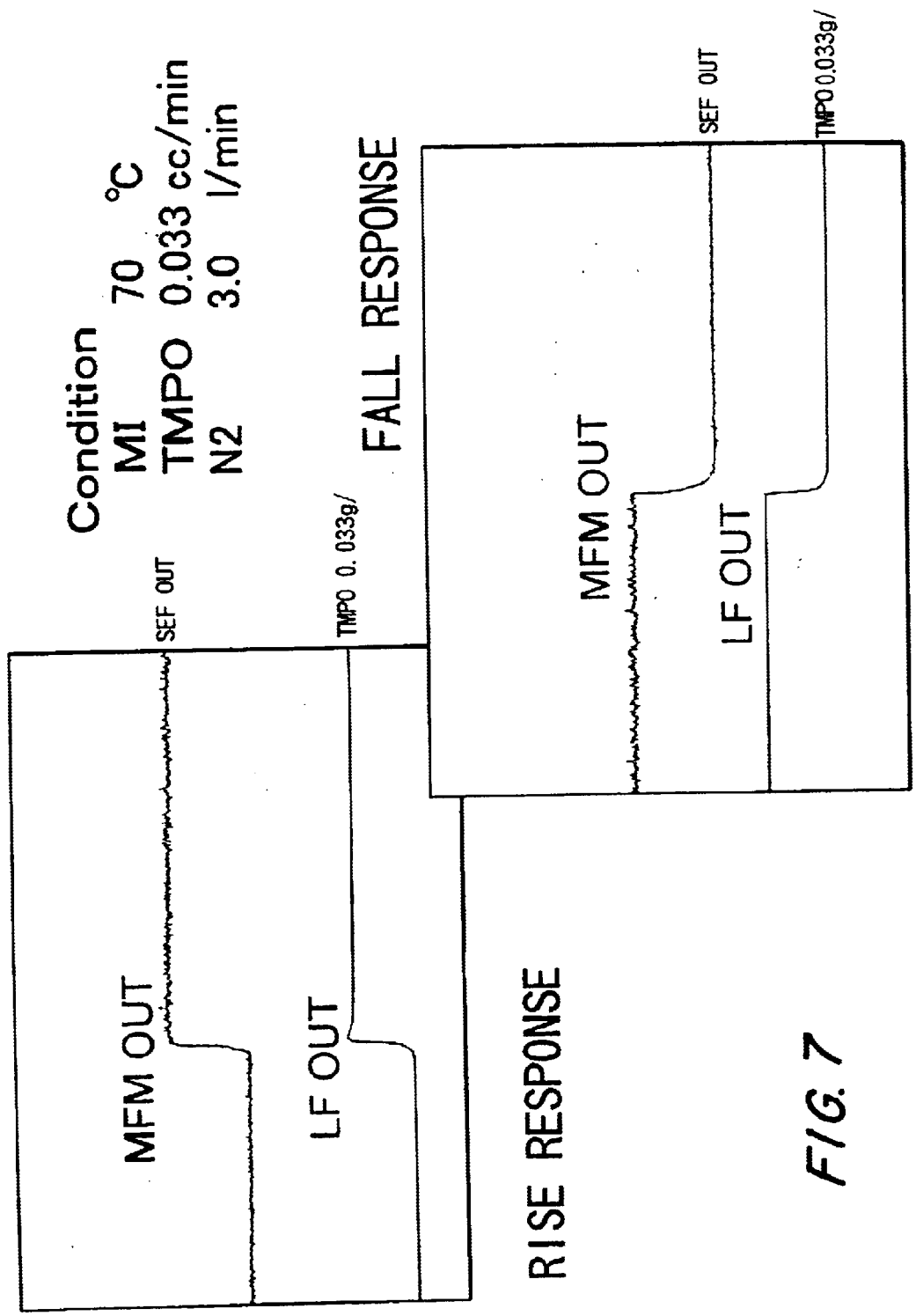
FIG. 7 is a composite view for illustrating the gasification condition of trimethyl phosphate with the liquid material gasifying apparatus.

FIG. 7 shows measurement data obtained with the above liquid marital gasifying apparatus at the time when trimethyl phosphate (TMPO) as a liquid material LM is gasified, and represents the results of observation of a change in the mixed gas KG led out from the control valve 1 at a time when the amount of introduction of the liquid material LM into the control valve 1 is instantaneously increased and decreased while keeping a constant flow rate of $N_2$ as a carrier gas CG.

That is to say, in the case of supplying the above carrier gas CG at the rate of 3.0 L/min. and the liquid material LM at the rate of 0.033 co/min. to the reaction furnace 20, measurements were made with the temperature of the heater 26 of the control valve 1 set at 70° C., and the liquid material LM in the gas-liquid mixture M was gasified under reduced pressure and supplied to the reaction furnace 20. In each graph shown in FIG. 7, the abscissa represents Time, and the ordinate represents the output amount measured by the flow meter 8 for liquid and the flow meter 18 for gas. In FIG. 7, MFM and SEF refer to a gas flow meter signal while LF refers to a liquid flow meter signal.

In order to properly flow trimethyl phosphate (TMPO) with conventional liquid material gasifying apparatus at 0.033 cc/min. to generate gas by gasification, a temperature of 130° C. is required. However, at such a high temperature, there is a problem in that TMPO showed self-decomposition and the decomposed matter was accumulated on the control valve to cause blocking. However, according to the liquid material gasification apparatus of the present invention, it is possible to flow TMPO at 70° C. at which self-decomposition of TMPO scarcely takes place at 0.033 cc/min. to cause gasification and generation, and as apparent from the fact that the output of the flow meter 18 closely follows the change of output of the flow meter 8 for liquid at the time when the flow of TMPO is instantaneously increased from zero to 0.033 cc/min. and the change of output of the flow meter 8 for liquid at the time when the flow of TMPO is instantaneously lowered from 0.033 co/min. to zero, gasification of TMPO is performed with increased stability.

FIGS. 8(A) to 8(C) are illustrative views showing a comparison of the adhesion conditions or deposits of TMPO in the vicinity of the valve sheet 37, wherein FIG. 8(A) shows the results of supplying the carrier gas CG at 3.0 L/min. and the liquid material LM at 0.033 cc/min. for 14 hours with the temperature in the vicinity of the valve seat set at 130° C., using the conventional liquid material gasifying apparatus. The same view in FIG. 8(B) shows the results of supplying the carrier gas CG at 3.0 L/min. and the liquid material LM at 0.033 cc/min. for 14 hours with the temperature in the vicinity of the valve seat 37 set at 130° C., using the liquid material gasifying apparatus of the present invention, and the FIG. 8(C) shows the results of supplying the carrier gas CG at 3.0 L/min. and supplying the liquid material LM at 0.033 cc/min. for 20 hours with the temperature in the vicinity of the valve seat 37 set at 70° C., using the liquid material gasifying apparatus of the present invention, respectively.

Figure 8:
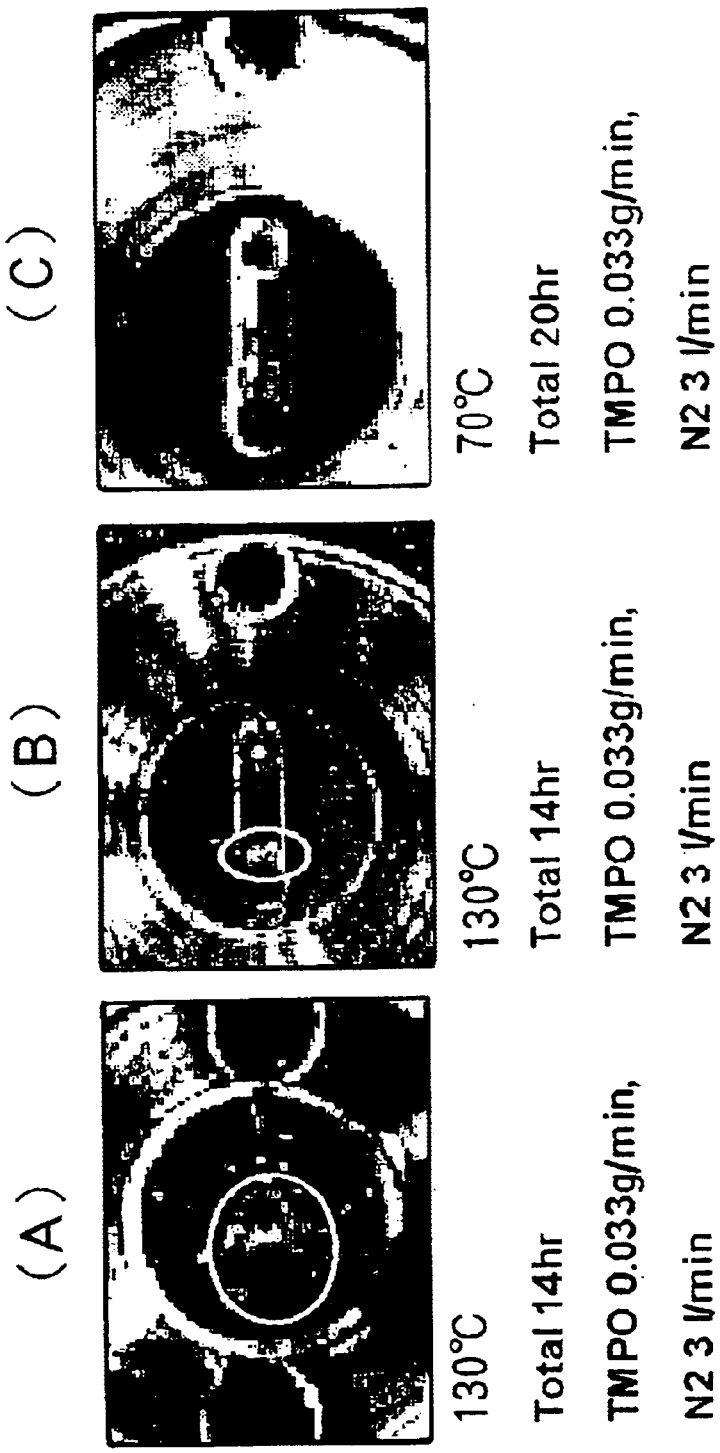
FIGS. 8(A), 8(B) and 8(C) are explanatory views comparing deposition conditions of trimethyl phosphate decomposition matters in the vicinity of the valve seat under different parameters.
Figure 9:
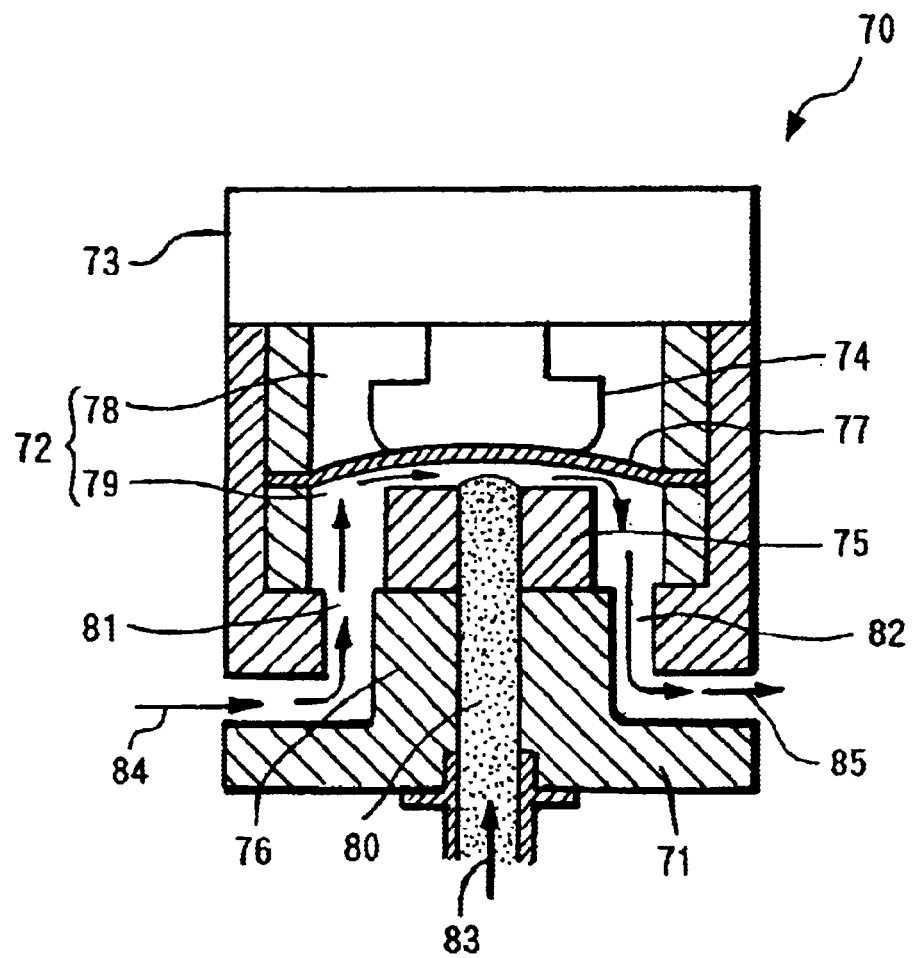
FIG. 9 is a vertical section showing a conventional liquid material gasifying
Figure 10:
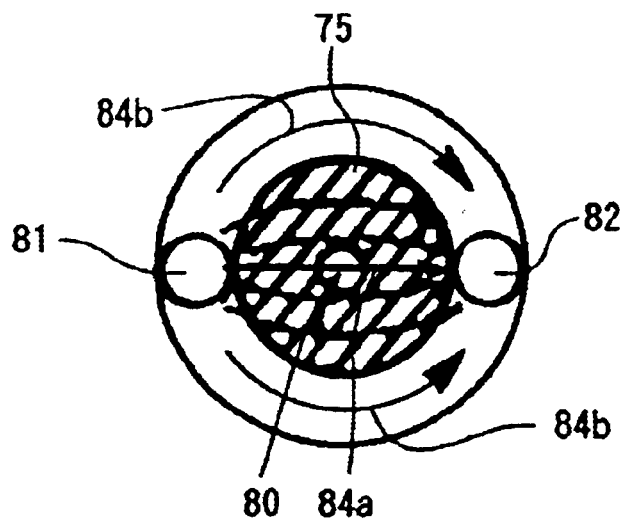
FIG. 10 is an explanatory view of the fluid motion of the above conventional liquid material gasifying apparatus.

It can be observed from FIGS. 8(A) and 8) t in case the temperature is set is at 130° C., even by using the liquid material gasifying apparatus of the present invention, deposition of TMPO decomposition matte in the vicinity of the valve seat 37 occurs, but the deposition area becomes small in FIG. 8(B) in comparison with the case of using the conventional liquid material gasifying apparatus in FIG. 8(A). Furthermore, it can be seen from FIG. 8(C) that, in setting the temperature at 70° C., there is scarcely any deposition of TMPO decomposition matter in the vicinity of the valve seat 37.

According to the liquid material gasifying apparatus of the present invention, the heating temperature required for gasifying liquid can be lowered, and even in the case of gasifying a liquid material which can show decomposition at a high temperature, it becomes possible to suppress such decomposition.

As described above, according to this invention, a liquid material and a carrier gas are mixed while making flow control in a gas-liquid mixing unit in the control valve provided with a liquid flow control function, and this gas-liquid mixture is subjected to reduced pressure at the nozzle. Accordingly, the liquid material can be gasified with good efficiency and under stabilized conditions.

What is claimed is:

1. A system for providing a controlled amount of a gas from a liquid source, comprising:
    a source of liquid;
    a source of a carrier gas;
    a control valve for mixing the liquid with the carrier gas and gasifying the liquid including:
        a valve body having a valve seat;
        a valve member for controlling the opening of the valve seat;
        a liquid inlet port for connection to the source of liquid;
        a liquid reservoir positioned operatively on one side of the valve seat and connected to the liquid inlet port;
        a carrier gas inlet port for connection to a source of carrier gas;
        a central mixing chamber positioned operatively on the other side of the
    valve seat in the control valve and connected to the carrier gas inlet port, the valve member seats on the valve seat around the central mixing chamber whereby the liquid is introduced radially inward to the mixing chamber by the control valve; and
        a release nozzle member with a restricted orifice connected to the mixing chamber wherein the valve member controls the delivery of liquid to the mixing chamber and the nozzle member releases the mixture of carrier gas and liquid reactant from the mixing chamber through the restricted orifice so that the liquid reactant is gasified when the pressure in the mixing chamber is sufficiently larger than the downstream pressure;
    a first conduit from the source of liquid to the control valve;
    a regulator unit attached to the first conduit to control the flow of liquid;
    a second conduit from the source of carrier gas to the control valve; and
    a control unit connected to the regulator unit and the control valve for controlling the production of gas, the control valve regulating the quantity of liquid and mixing the carrier gas with the liquid at a first pressure level greater than a second pressure level downstream of the release nozzle whereby the liquid mixed with the carrier gas is gasified with the assistance of the pressure differential.

2. The invention of claim 1 further including a heater unit connected to the control valve to heat the liquid.

3. The invention of claim 2 further including a second regulator unit for controlling the flow of carrier gas and the control unit controls the second regulator unit.

4. The invention of claim 1 whereby the control valve includes a reservoir for receiving the liquid that is radially outward from the valve seat.

5. The invention of claim 4 wherein a heater unit is connected to the control valve to heat the liquid.

6. The invention of claim 1 wherein the valve body includes a diaphragm with a rigid outer perimeter.

7. A system for providing a controlled amount of a gas from a liquid source, comprising:
    a source of liquid;
    a source of a carrier gas;
    a control valve for mixing the liquid with the carrier gas and gasifying the liquid including:
        a valve body having a valve seat;
        a valve member for controlling the opening of the valve seat;
        a liquid inlet port for connection to the source of liquid;
        a liquid reservoir positioned operatively on one side of the valve seat and connected to the liquid inlet port;
        a carrier gas inlet port for connection to a source of carrier gas;
        a mixing chamber positioned operatively on the other side of the valve seat and connected to the carrier gas inlet port; and
        a release nozzle member with a restricted orifice connected to the mixing chamber wherein the valve member controls the delivery of liquid to the mixing chamber and the nozzle member releases the mixture of carrier gas and liquid reactant from the mixing chamber through the restricted orifice so that the liquid reactant is gasified when the pressure in the mixing chamber is sufficiently larger than the downstream pressure;
    a first conduit from the source of liquid to the control valve;
    a regulator unit attached to the first conduit to control the flow of liquid;
    a second conduit from the source of carrier gas to the control valve; and
    a control unit connected to the regulator unit and the control valve for controlling the production of gas, the control valve regulating the quantity of liquid and mixing the carrier gas with the liquid at a first pressure level greater than a second pressure level downstream of the release nozzle whereby the liquid mixed with the carrier gas is gasified with the assistance of the pressure differential wherein the liquid reservoir is radially outward from the valve seat and the mixing chamber is radially inward from the valve seat whereby the valve member controls the inward flow of liquid to the mixing chamber.

8. The invention of claim 7 wherein the mixing chamber is an elongated groove.

9. The invention of claim 7 further including a discharge conduit from the release nozzle member that is heated.

10. A system for providing a controlled amount of a gas from a liquid source, comprising:

a source of liquid;

a source of a carrier gas;

a control valve for mixing the liquid with the carrier gas and gasifying the liquid including a release nozzle, including a central mixing chamber in the control valve and a valve member that seats on a valve seat around the central mixing chamber whereby the liquid is introduced radially inward to the mixing chamber by the control valve;

a first conduit from the source of liquid to the control valve;

a regulator unit attached to the first conduit to control the flow of liquid;

a second conduit from the source of carrier gas to the control valve; and a control unit connected to the regulator unit and the control valve for controlling the production of gas, the control valve regulating the quantity of liquid and mixing the carrier gas with the liquid at a first pressure level greater than a second pressure level downstream of the release nozzle whereby the liquid mixed with the carrier gas is gasified with the assistance of the pressure differential.

11. The invention of claim 10 further including a heater unit connected to the control valve to heat the liquid.

12. The invention of claim 11 further including a second regulator unit for controlling the flow of carrier gas and the control unit controls the second regulator unit.

13. The invention of claim 10 whereby the control valve includes a reservoir for receiving the liquid that is radially outward from the valve seat.

14. The invention of claim 13 wherein a heater unit is connected to the control valve to heat the liquid.

* * * * *